(12) United States Patent
Huang (10) Patent No.: US 10,619,941 B2
(45) Date of Patent: Apr. 14, 2020

(54) HEAT PIPE STRUCTURE

(71) Applicant: DELTA ELECTRONICS, INC., Taoyuan (TW)

(72) Inventor: Shih-Lin Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 177 days.

(21) Appl. No.: 15/718,428

(22) Filed: Sep. 28, 2017

(65) Prior Publication Data

US 2018/0087844 A1 Mar. 29, 2018

Related U.S. Application Data

(60) Provisional application No. 62/401,397, filed on Sep. 29, 2016.

(30) Foreign Application Priority Data

Sep. 11, 2017 (CN) .......................... 2017 1 0813463

(51) Int. Cl.
| | |
|---|---|
| F28D 15/04 | (2006.01) |
| F28F 9/26 | (2006.01) |
| H05K 7/20 | (2006.01) |
| F28D 15/02 | (2006.01) |
| F28F 3/12 | (2006.01) |

(52) U.S. Cl.
CPC ......... *F28D 15/04* (2013.01); *F28D 15/0233* (2013.01); *F28D 15/0283* (2013.01); *F28F 3/12* (2013.01); *F28F 9/26* (2013.01); *H05K 7/20336* (2013.01); *F28F 2210/02* (2013.01); *F28F 2275/025* (2013.01); *F28F 2275/061* (2013.01);

(Continued)

(58) Field of Classification Search
CPC .. F28D 15/04; F28D 15/0233; F28D 15/0283; F28F 3/12; F28F 9/26; F28F 2210/02; F28F 2275/025; F28F 2275/061; F28F 2275/065; F28F 2275/067; H05K 7/20336
USPC ............. 165/80.4, 170, 168, 104.21, 104.26, 165/104.19, 104.13, 104.14
See application file for complete search history.

(56) References Cited

U.S. PATENT DOCUMENTS

| | | | |
|---|---|---|---|
| 5,769,154 A * | 6/1998 | Adkins | ............... F28D 15/0233 |
| | | | 126/96 |
| 6,056,044 A * | 5/2000 | Benson | ............... F28D 15/0233 |
| | | | 165/104.26 |

(Continued)

FOREIGN PATENT DOCUMENTS

| | | |
|---|---|---|
| CN | 1845321 A | 10/2006 |
| CN | 204539691 U | 8/2015 |
| CN | 105451513 A | 3/2016 |

*Primary Examiner* — Justin M Jonaitis
(74) *Attorney, Agent, or Firm* — Muncy, Geissler, Olds & Lowe, P.C.

(57) ABSTRACT

A heat pipe structure includes a first plate, a second plate and a plurality of wick structures. The second plate is connected to the first plate to form a chamber. The wick structures are disposed in the chamber, and the distribution shape of the wick structures is approximately the same as the shape of a portion of the chamber. The chamber is formed by at least one coupling portion and three or more extending portions. The coupling portion communicates with the extending portions, and the contour of the connected first and second plates is different from that of the chamber.

9 Claims, 6 Drawing Sheets

(52) U.S. Cl.
CPC ... *F28F 2275/065* (2013.01); *F28F 2275/067* (2013.01)

(56) References Cited

U.S. PATENT DOCUMENTS

| | | | | |
|---|---|---|---|---|
| 6,058,009 | A * | 5/2000 | Hood, III | G06F 1/203 |
| | | | | 361/679.47 |
| 6,164,368 | A * | 12/2000 | Furukawa | F28D 15/0233 |
| | | | | 165/104.33 |
| 6,167,948 | B1 * | 1/2001 | Thomas | F28D 15/02 |
| | | | | 165/104.26 |
| 6,504,720 | B2 * | 1/2003 | Furuya | H01L 23/427 |
| | | | | 165/104.33 |
| D490,781 | S * | 6/2004 | Niwatsukino | D13/179 |
| 7,518,861 | B2 * | 4/2009 | Lev | G06F 1/203 |
| | | | | 165/104.33 |
| 8,490,678 | B2 * | 7/2013 | Kim | F28F 3/048 |
| | | | | 165/80.2 |
| 9,625,215 | B2 | 4/2017 | Hsiao | |
| 2001/0023757 | A1 * | 9/2001 | Huang | F28D 15/0266 |
| | | | | 165/104.26 |
| 2002/0062648 | A1 * | 5/2002 | Ghoshal | F28D 15/0233 |
| | | | | 62/3.7 |
| 2003/0024691 | A1 * | 2/2003 | Tsay | F28D 15/0233 |
| | | | | 165/104.26 |
| 2006/0113662 | A1 * | 6/2006 | Cepeda-Rizo | F28D 15/0233 |
| | | | | 257/714 |

\* cited by examiner

HEAT PIPE STRUCTURE

CROSS REFERENCE TO RELATED APPLICATIONS

The non-provisional patent application claims priority to U.S. provisional patent application with Ser. No. 62/401,397 filed on Sep. 29, 2016. This and all other extrinsic materials discussed herein are incorporated by reference in their entirety.

This Non-provisional application claims priority under 35 U.S.C. § 119(a) on Patent Application No(s). 201710813463.3 filed in People's Republic of China on Sep. 11, 2017, the entire contents of which are hereby incorporated by reference.

BACKGROUND OF THE INVENTION

Field of Invention

The present disclosure relates to a heat pipe structure having at least three extending portions.

Related Art

The existing electronic devices are developed to be portable, have a compact size and light weight, and provide with more additional functions. Since the entire size of the electronic device becomes smaller, the internal space for accommodating the other components is limited. However, the high performance electronic device will generate a lot of heat in operation. If the heat cannot be dissipated immediately, the temperature inside the electronic device will increase, which may damage the internal components and decrease the function and lifetime of the electronic device. A heat pipe structure is a common heat dissipation device for dissipating the heat to the environment. The heat dissipation theory thereof is to utilize the phase change and heat convection of the working fluid disposed inside the plate body for carrying the heat to the condensing end and dissipating the heat. Then, the working fluid flows back to the heat source via the wick structures, and the flow of the working fluid can bring the heat away.

However, the thickness and configuration of the heat pipe structure are limited to the arrangement of the components inside the electronic device. Therefore, it is desired to decrease the thickness of the heat pipe structure without affecting the heat conduction efficiency of the heat pipe structure, so that the configuration of the heat pipe structure can fit to the limited space inside the electronic device so as to increase the configuration flexibility of the heat pipe structure.

Accordingly, it is an important subject to provide a heat pipe structure having a thinner thickness so as to increase the configuration flexibility thereof.

SUMMARY OF THE INVENTION

To achieve the above, the present disclosure provides a heat pipe structure including a first plate, a second plate and a plurality of wick structures. The second plate is connected to the first plate to form a chamber. The wick structures are disposed in the chamber. A distribution shape of the wick structures is approximately the same as that of a portion of the chamber. The chamber is formed by at least one coupling portion and three or more extending portions. The coupling portion communicates with the extending portions, and a contour of the connected first and second plates is different from a contour of the chamber.

In one embodiment, the length, width or height of at least one of the extending portions is different from the lengths, widths or heights of the other extending portions.

In one embodiment, thicknesses or sizes of the first and second plates are different.

In one embodiment, the first and second plates are connected by a heating welding process or a frit bonding process at a point close to a side wall of the chamber to form a sealing portion.

In one embodiment, the heating welding process includes a laser welding, a diffusion welding, a supersonic welding or any of their combinations.

In one embodiment, the fit bonding process includes a hard welding, a glue bonding or any of their combinations.

In one embodiment, the heating welding process or the frit bonding process is a lateral connecting type.

In one embodiment, the first or second plate is directly contacted with a heat source.

In one embodiment, the heat pipe structure further includes at least a water injecting channel communicating with the chamber.

The present disclosure also provides a heat pipe structure including a first plate, a second plate and a plurality of wick structures. The second plate is connected to the first plate to form a chamber. The wick structures are disposed in the chamber. A distribution shape of the wick structures is approximately the same as that of a portion of the chamber. The chamber is formed by at least one coupling portion and three or more extending portions, and the coupling portion communicates with the extending portions.

In one embodiment, the length, width or height of at least one of the extending portions is different from the lengths, widths or heights of the other extending portions.

In one embodiment, thicknesses or sizes of the first and second plates are different.

In one embodiment, the first and second plates are connected by a heating welding process or a frit bonding process at a point close to a side wall of the chamber to form a sealing portion.

In one embodiment, the heating welding process includes a laser welding, a diffusion welding, a supersonic welding or any of their combinations.

In one embodiment, the frit bonding process includes a hard welding, a glue bonding or any of their combinations.

In one embodiment, the heating welding process or the fit bonding process is a lateral connecting type.

In one embodiment, the first or second plate is directly contacted with an external heat source.

In one embodiment, the heat pipe structure further includes at least a water injecting channel communicating with the chamber.

As mentioned above, the heat pipe structure of this disclosure is manufactured by connecting the first and second plates, and this configuration can reduce the thickness of the heat pipe structure. The side wall and contour of the chamber can be properly designed and changed based on the configuration of the chamber instead of the conventional rectangular. Moreover, the chamber further has at least one coupling portion and at least three extending portions, so that the heat pipe structure can penetrate between the internal components of the electronic device. This configuration can adapt to the limited space inside the electronic device, increase the configuration flexibility of the heat pipe structure, and properly utilize the internal space of the electronic device.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
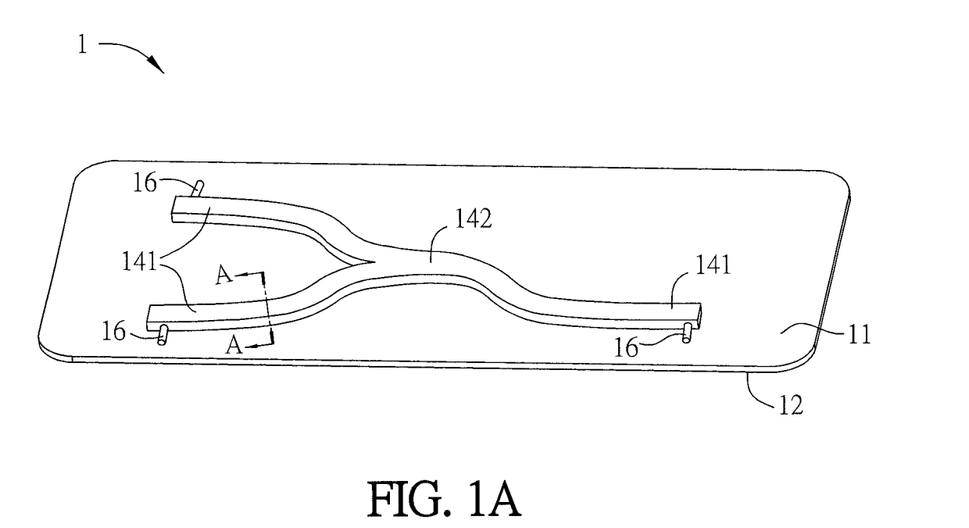
FIG. 1A is a schematic diagram of a heat pipe structure according to an embodiment of the disclosure.

The basic structure and the feature of an embodiment of the heat pipe structure of this disclosure will be described hereinafter with reference to FIGS. 1A and 1B. FIG. 1A is a schematic diagram of a heat pipe structure according to an embodiment of the disclosure, and FIG. 1B is a sectional view of a part of the heat pipe structure of FIG. 1A along the line A-A.

A heat pipe structure 1 includes a first plate 11, a second plate 12, and a plurality of wick structures 13. The second plate 12 is connected to the first plate 11 to faun a chamber 14. The wick structures 13 are disposed in the chamber 14. A distribution shape of the wick structures 13 is approximately the same as a shape of a portion of the chamber 14. The chamber 14 is formed by at least one coupling portion 142 and three or more extending portions 141. The coupling portion 142 communicates with the extending portions 141, and a contour of the first and second plates 11, 12, which are connected, is different from a contour of the chamber 14. The first plate 11 or the second plate 12 is directly contacted with an external heat source (not shown).

Figure 1B:
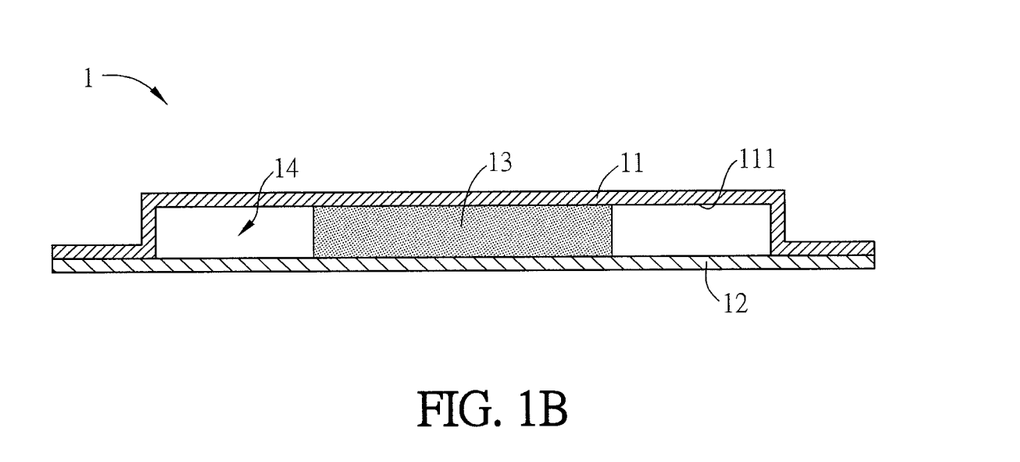
FIG. 1B is a sectional view of a part of the heat pipe structure of FIG. 1A along the line A-A.

As shown in FIG. 1B, in this embodiment, the first plate 11 has a trench 111, and the trench 111 and the second plate 12 together form the chamber 14. In practice, the trench 111 can be formed by punching the first plate 11 to provide an accommodating space so that the trench 111 and the second plate 12 together form the chamber 14. The wick structures 13 are disposed in the chamber 14.

In this embodiment, the contour of the chamber 14 is not rectangular. In addition, the length, width or height of at least one of the extending portions 141 is different from the lengths, widths or heights of the other extending portions 141. Moreover, the contour of the chamber 14 can be designed and changed based on the space configuration so that the thicknesses or sizes of the first plate 11 and the second plate 12 can be different.

Moreover, the heat pipe structure 1 further includes at least a water injecting channel 16 communicating with the chamber 14. The water injecting channel 16 is configured to fill the working fluid into the chamber 14 and to vacuum the chamber 14. After filling the working fluid and vacuum the chamber, the water injecting channel 16 is sealed.

Figure 2A:
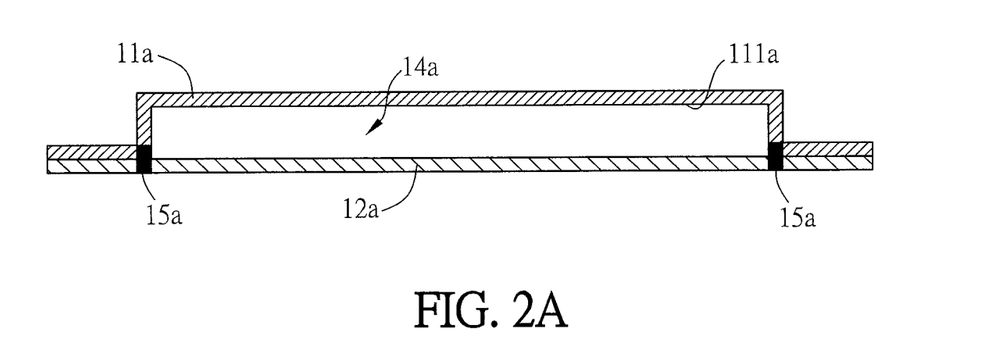
FIGS. 2A to 2E are schematic diagrams shown different aspects of the connected first and second plates.
Figure 2B:
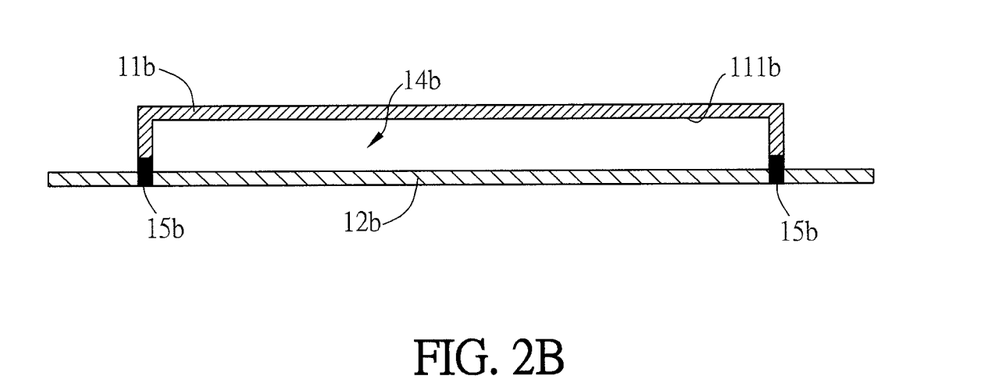
Figure 2C:
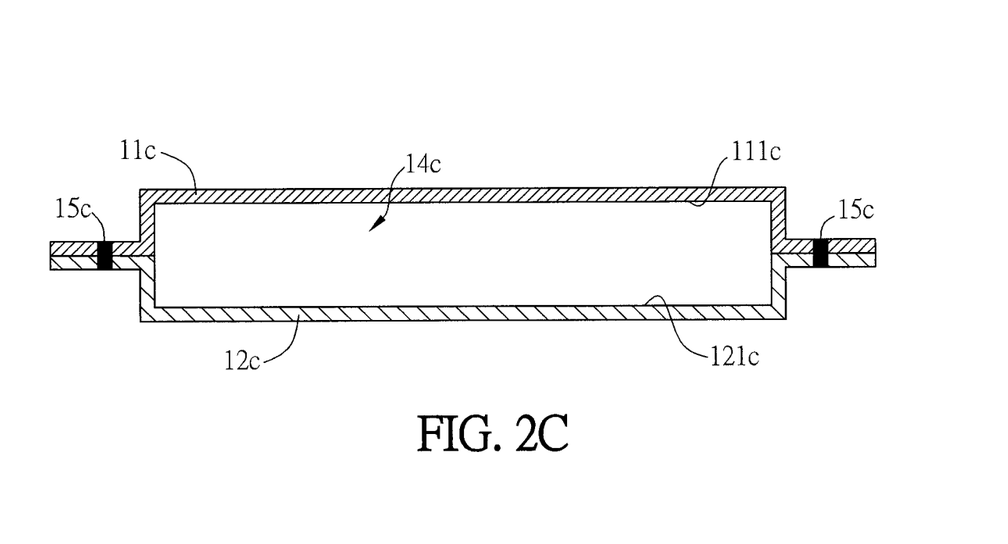
Figure 2D:
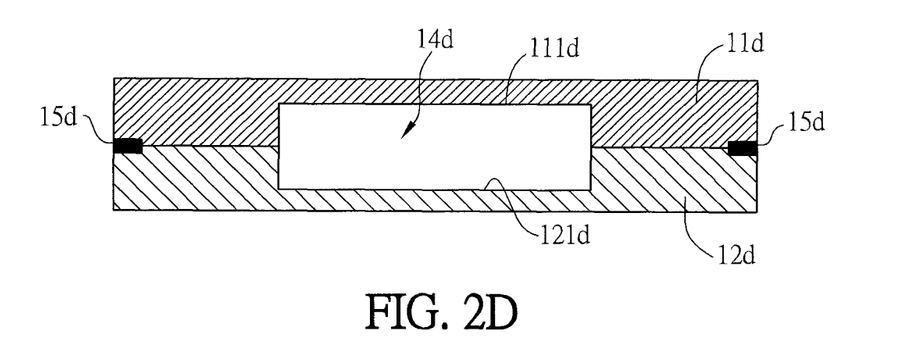
Figure 2E:
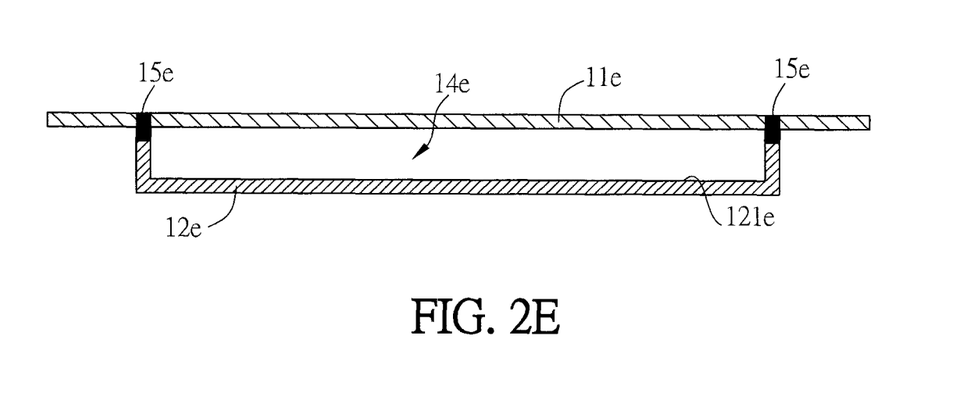

The different aspects of the connection of the first plate and the second plate will be described hereinafter with reference to FIGS. 1B and 2A to 2E. The first plate 11 or the second plate 12 has a trench 111, and the trench 111, and the first and second plates 11, 12 or another trench (not shown) together form the chamber 14. As shown in FIGS. 2A to 2D, the first plates 11a, 11b, 11c and 11d have trenches 111a, 111b, 111c and 111d, respectively. Alternatively, as shown in FIG. 2E, the first plate 11e is a flat plate. As shown in FIGS. 2C to 2E, the second plates 12c, 12d and 12e have trenches 121c, 121d and 121e, respectively. Alternatively, as shown in FIGS. 2A and 2B, each of the second plates 12a and 12b is a flat plate.

As shown in FIG. 1B, the trench 111 can be formed by punching the first plate 11 or the second plate 12. As shown in FIG. 2D, the trench 111d or 121d can be formed on the first plate 11d or the second plate 12d by chemical etching. The trench can provide an accommodating space, and the trench can be combined with another plate or another trench to form a chamber. The wick structures can be disposed in the chamber.

The connection of the first and second plates will be described hereinafter. As shown in FIG. 2A, the first and second plates 11a, 12a are connected by a heating welding or frit bonding process at a point close to a side wall of the chamber 14a to form a sealing portion 15a. In other words, the sealing portion 15a is located at the junction of the first and second plates 11a, 12a and is close to the trench 111a of the first plate 11a or the second plate 12a. In more detailed, the sealing portion 15a is located at the junction of the first and second plates 11a, 12a. Based on the manufacturing processes and designs of the chamber 14a, the sealing portions 15a, 15b and 15e can be formed on the side walls of the chambers 14a, 14b and 14e (see FIGS. 2A, 2B and 2E), respectively. In addition, the sealing portions 15c and 15d can be formed at a place close to the side walls of the chambers 14c and 14d (see FIGS. 2C and 2D), respectively. In this embodiment, the distribution shape of the sealing portion 15a is corresponding to the contour of the chamber 14a.

Figure 2F:
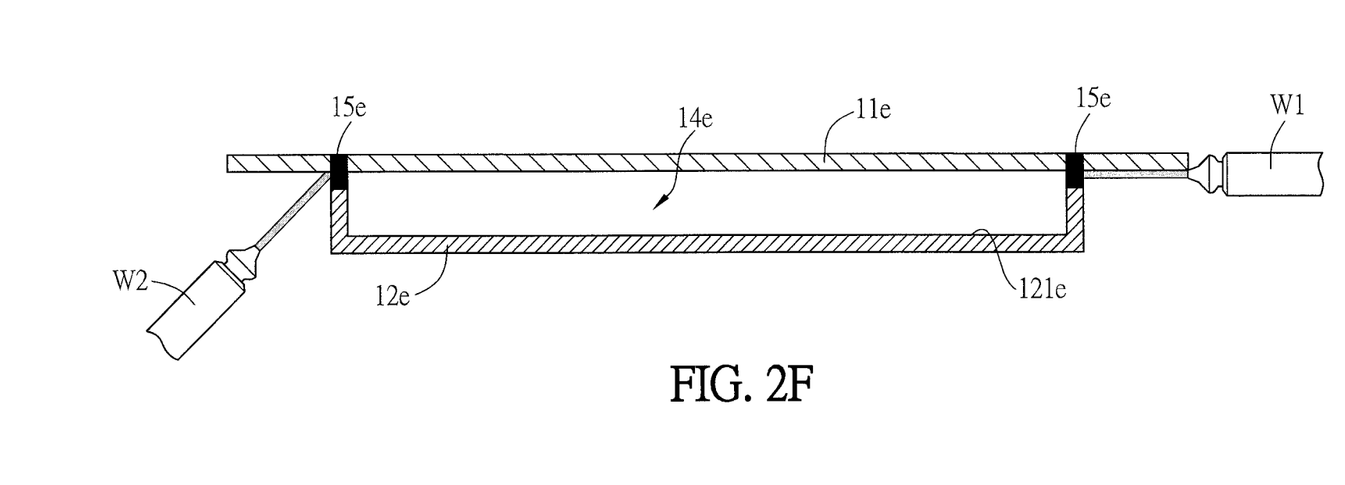
FIG. 2F is a schematic diagram showing a lateral connecting of the first and second plates.

FIG. 2F is a schematic diagram showing a lateral connecting of the first and second plates. As shown in FIG. 2F, the first and second plates 11e, 12e can be connected by the heating welding process, which only heats one side in a local portion with high temperature and is solderless, to form the sealing portion 15e. The heating welding process includes a laser welding, a diffusion welding, a supersonic welding, or any of their combinations. In addition, the welding process can be a front welding or a lateral welding. The front welding is to perform the welding process with a welding angle perpendicular to the first and plates 11e, 12e. The lateral welding is to perform the welding process with a welding angle not perpendicular to the first and second plates 11e, 12e. Besides, the first and second plates 11e, 12e can be connected by the frit bonding process to form a larger sealing portion 15e. Herein, the frit bonding process includes a hard welding, a glue bonding, or any of their combinations. As shown in FIG. 2F, in this embodiment, the heating welding or fit bonding process is a lateral connecting type. The welding head W1 is placed at a direction parallel to the first plate 11e and then performs the welding process to sealing the first and second plates 11e, 12e. Alternatively, the welding head W2 performs the welding process with a welding angle of 45 degrees with respect to the first plate 11e or the second plate 12e.

Figure 3A:
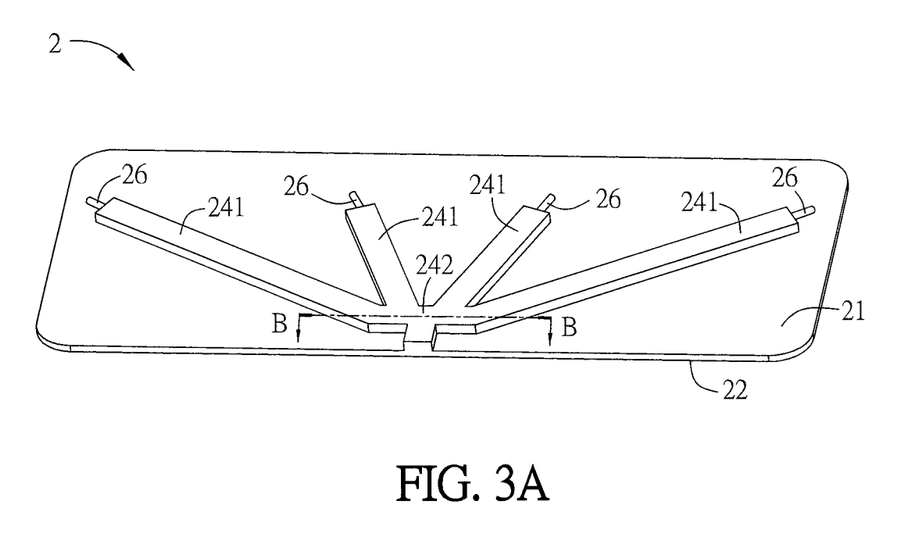
FIG. 3A is a schematic diagram of a heat pipe structure according to another embodiment of the disclosure.
Figure 3B:
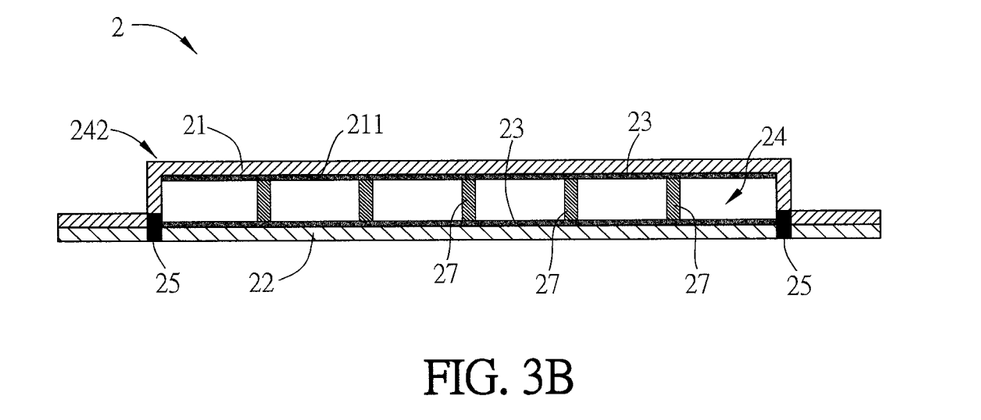
FIG. 3B is a sectional view of a part of the heat pipe structure of FIG. 3A along the line B-B.

FIG. 3A is a schematic diagram of a heat pipe structure according to another embodiment of the disclosure, and FIG. 3B is a sectional view of a part of the heat pipe structure of FIG. 3A along the line B-B.

As shown in FIGS. 3A and 3B, the heat pipe structure 2 includes a first plate 21, a second plate 22, and a plurality of wick structures 23. The second plate 22 is connected to the first plate 21 to form a chamber 24. The wick structures 23 are disposed in the chamber 24. A distribution shape of the wick structures 23 is approximately the same as that of a portion of the chamber 24. The chamber 24 is formed by at least one coupling portion 242 and three or more extending portions 241, and the coupling portion 242 communicates with the extending portions 241.

In this embodiment, the contour of the chamber 24 is not rectangular. In addition, the length, width or height of at least one of the extending portions 241 is different from the lengths, widths or heights of the other extending portions 241. Moreover, the contour of the chamber 24 can be designed and changed based on the space configuration so that the thicknesses or sizes of the first and second plates 21, plate 22 can be different. When the chamber 24 has three or more extending portions 241, the distances between the extending portions 241 and the edge of the first plate 21 or the second plate 22 are different. The extending directions of the extending portions 241 can be the same or different so that the heat pipe structure 2 can penetrate between the internal components of the electronic device. This configuration can adapt to the limited space inside the electronic device, increase the configuration flexibility of the heat pipe structure 2, and properly utilize the internal space of the electronic device.

Moreover, the heat pipe structure 2 further includes at least one supporting structure 27. The supporting structure 27 is disposed at the coupling portion 242. One end of the supporting structure 27 is contacted against the first plate 21 or the wick structure 23, and the other end of the supporting structure 27 is contacted against second plate 22 or the wick structure 23. In this embodiment, the supporting structure 27 is, for example but not limited to, a supporting pillar, a supporting block with regular or irregular shape. The supporting structure 27 can be a solid metal block structure, be composed of the wick structures 23, or contain the wick structures 23. The configuration of the supporting structure 27 can provide a return path of the working fluid inside the chamber 24 of the heat pipe structure 2, or support the first plate 21 and the second plate 22 to prevent the deformation or subsidence.

In this embodiment, the heat pipe structure 2 further includes at least a water injecting channel 26 communicating with the chamber 24. The water injecting channel 26 is configured to fill the working fluid into the chamber 24 and to vacuum the chamber 24. After filling the working fluid and vacuum the chamber, the water injecting channel 26 is sealed.

As shown in FIG. 3B, in this embodiment, the contour defined by the first plate 21 is approximate to the contour of the chamber. The different aspects of the connections of the first and second plates 21, 22 can be referred to FIGS. 2A to 2E, so the detailed description thereof will be omitted. The first and second plates 21, 22 are connected by a heating welding or frit bonding process at a point close to a side wall of the chamber 24 to form a sealing portion 25. In other words, the sealing portion 25 is located at the junction of the first and second plates 21, plate 22 and is close to the trench 211 of the first plate 21 or the second plate 22. In more detailed, the sealing portion 25 is located at the junction of the first and second plates 21, 22. Based on the manufacturing processes and designs of the chamber 24, the sealing portion 25 can be formed on the side wall of the chamber 24. In addition, the sealing portion 25 can be formed at a place close to the side wall of the chamber 24. In this embodiment, the distribution shape of the sealing portion 25 is corresponding to the contour of the chamber 24.

The first and second plates 21, 22 can be connected by the heating welding process, which only heats one side in a local portion with high temperature and is solderless, to form the sealing portion 25. The heating welding process includes a laser welding, a diffusion welding, a supersonic welding, or any of their combinations. In addition, the welding process can be a front welding or a lateral welding. The front welding is to perform the welding process with a welding angle perpendicular to the first and second plates 21, 22. The lateral welding is to perform the welding process with a welding angle not perpendicular to the first and second plates 21, 22. Besides, the first and second plates 21, 22 can be connected by the frit bonding process to form a larger sealing portion 25. Herein, the frit bonding process includes a hard welding, a glue bonding or any of their combinations. As shown in FIG. 2F, in this embodiment, the heating welding process or the frit bonding process is a lateral connecting type. The detailed description thereof can be referred to the above embodiment and will be omitted here.

Figure 4A:
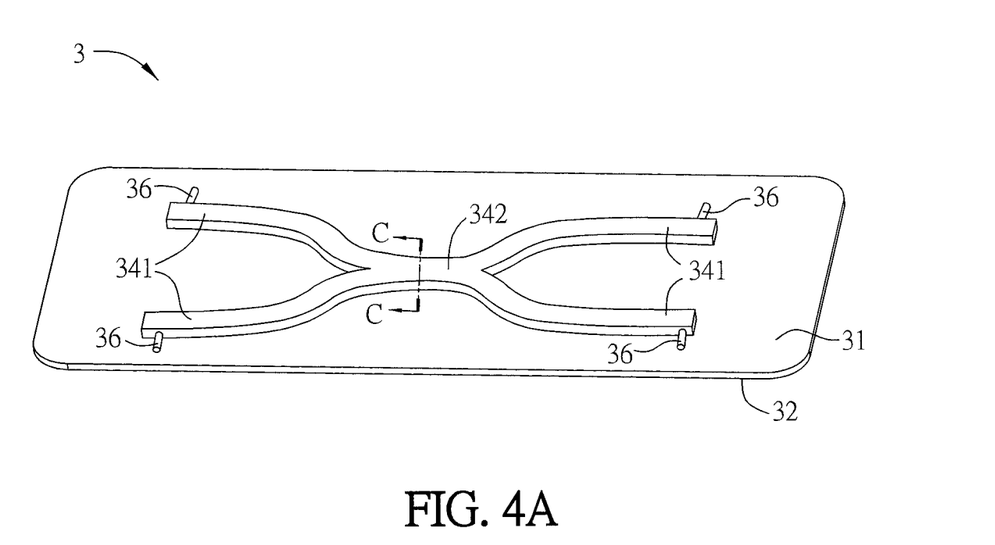
FIG. 4A is a schematic diagram of a heat pipe structure according to another embodiment of the disclosure.
Figure 4B:
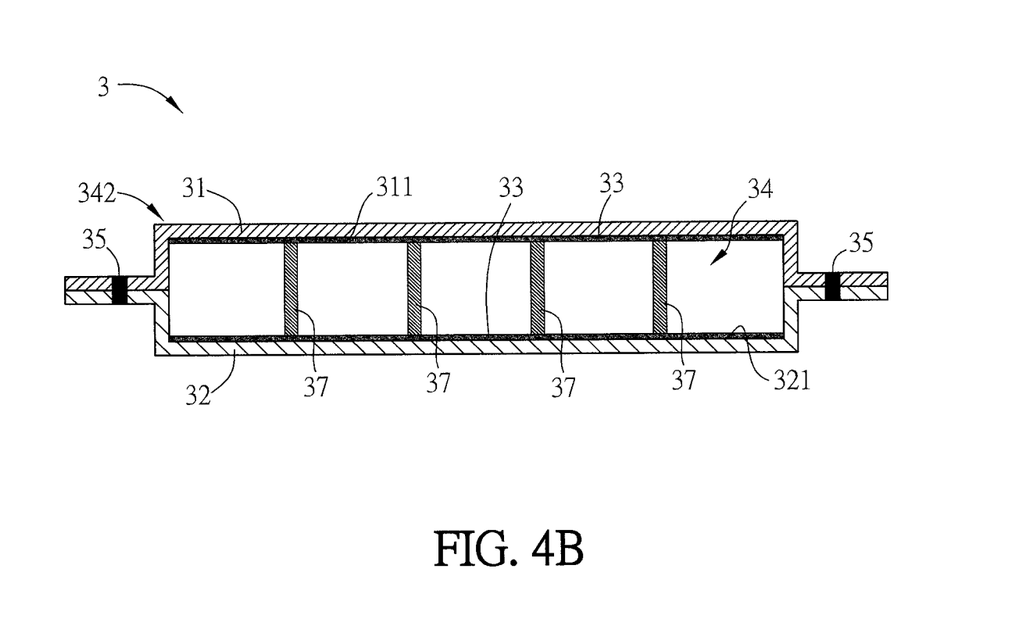
FIG. 4B is a sectional view of a part of the heat pipe structure of FIG. 4A along the line C-C.

FIG. 4A is a schematic diagram of a heat pipe structure according to another embodiment of the disclosure, and FIG. 4B is a sectional view of a part of the heat pipe structure of FIG. 4A along the line C-C.

As shown in FIGS. 4A and 4B, the heat pipe structure 3 includes a first plate 31, a second plate 32, and a plurality of wick structures 33. The second plate 32 is connected to the first plate 31 to form a chamber 34. The wick structures 33 are disposed in the chamber 34. A distribution shape of the wick structures 33 is approximately the same as that of a portion of the chamber 34. The chamber 34 is formed by at least one coupling portion 342 and three or more extending portions 341, and the coupling portion 342 communicates with the extending portions 341. A contour of the first and second plates 31, 32, which are connected to each other, is different from a contour of the chamber 34.

In this embodiment, the different aspects of the connections of the first and second plates 31, plate 32 can be referred to FIGS. 2A to 2E, so the detailed description thereof will be omitted.

In this embodiment, the contour of the chamber 34 is not rectangular. In addition, the length, width or height of at least one of the extending portions 341 is different from the lengths, widths or heights of the other extending portions 341. Moreover, the contour of the chamber 34 can be designed and changed based on the space configuration so that the thicknesses or sizes of the first and second plates 31, 32 can be different. When the chamber 34 has three or more extending portions 341, the distances between the extending portions 341 and the edge of the first plate 31 or the second plate 32 are different. The extending directions of the extending portions 341 can be the same or different. Moreover, the heat pipe structure 3 further includes at least one supporting structure 37. The supporting structure 37 is disposed at the coupling portion 342. One end of the supporting structure 37 is contacted against the first plate 31 or the wick structure 33, and the other end of the supporting structure 37 is contacted against the second plate 32 or the wick structure 33. In this embodiment, the supporting structure 37 is, for example but not limited to, a supporting pillar or a supporting block with regular or irregular shape. The supporting structure 37 can be a solid metal block structure, be composed of the wick structures 33, or contain the wick structures 33. The configuration of the supporting structure 37 can provide a return path of the working fluid inside the chamber 34 of the heat pipe structure 3, or support the first plate 31 and the second plate 32 to prevent the deformation or subsidence.

In this embodiment, the heat pipe structure 3 further includes at least a water injecting channel 36 communicating with the chamber 34. The water injecting channel 36 is configured to fill the working fluid into the chamber 34 and to vacuum the chamber 34. After filling the working fluid and vacuum the chamber, the water injecting channel 36 is sealed.

The first and second plates 31, 32 are connected by a heating welding or frit bonding process at a point close to a side wall of the chamber 34 to form a sealing portion 35. In other words, the sealing portion 35 is located at the junction of the first and second plates 31, 32 and is close to the trench 311 or 321 of the first plate 31 or the second plate 32. In more detailed, the sealing portion 35 is located at the junction of the first and second plates 31, 32. Based on the manufacturing processes and designs of the chamber 34, the sealing portion 35 can be formed on the side wall of the chamber 34. In addition, the sealing portion 35 can be formed at a place close to the side wall of the chamber 34. In this embodiment, the distribution shape of the sealing portion 35 is corresponding to the contour of the chamber 34.

The first and second plates 31, 32 can be connected by the heating welding process, which only heats one side in a local portion with high temperature and is solderless, to form the sealing portion 35. The heating welding process includes a laser welding, a diffusion welding, a supersonic welding or any of their combinations. In addition, the welding process can be a front welding or a lateral welding. The front welding is to perform the welding process with a welding angle perpendicular to the first and second plates 31, 32. The lateral welding is to perform the welding process with a welding angle not perpendicular to the first and second plates 31, 32. Besides, the first and second plates 31, 32 can be connected by the frit bonding process to form a larger sealing portion 35. Herein, the frit bonding process includes a hard welding, a glue bonding or any of their combinations. As shown in FIG. 2F, in this embodiment, the heating welding process or the frit bonding process is a lateral connecting type. The detailed description thereof can be referred to the above embodiment and will be omitted here.

In summary, the heat pipe structure of this disclosure is manufactured by connecting the first and second plates in different designs, and this configuration can reduce the thickness of the heat pipe structure. The side wall and contour of the chamber can be properly designed and changed based on the configuration of the chamber instead of the conventional rectangular. Moreover, the chamber further has at least one coupling portion and at least three extending portions so that the heat pipe structure can penetrate between the internal components of the electronic device. This configuration can adapt to the limited space inside the electronic device, increase the configuration flexibility of the heat pipe structure, and properly utilize the internal space of the electronic device.

In practice, the trench of the first plate or the second plate can be formed by punching or chemical etching so that the heat pipe structure having at least one coupling portion and three or more extending portions can be manufactured in one process. This feature can reduce the manufacturing process and decrease the manufacturing cost. In addition, the connection of the first and second plates can be optionally performed by the heating welding process or the frit bonding process based on the contour of the chamber. The heating welding or fit bonding process is a lateral connecting type. This configuration can minimize the welding width and increase the configuration flexibility of the heat pipe structure. Accordingly, the heat pipe structure of this disclosure can provide a heat-dissipation area (like the vapor chamber) and have the ability to carry the heat away rapidly (like the conventional heat pipe).

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A heat pipe structure, comprising:
   a first plate;
   a second plate connected to the first plate to form a chamber, wherein the chamber is formed by at least one coupling portion and three or more extending portions, and the coupling portion communicates with the extending portions;
   a plurality of supporting structures disposed at the coupling portion; and
   a plurality of wick structures disposed in the chamber, wherein a distribution shape of the wick structures is approximately the same as a shape of a portion of the chamber, the supporting structures are located within the chamber formed by the first and second plates and are structures separate from the first and second plates.

2. The heat pipe structure of claim 1, wherein a length, a width or a height of at least one of the extending portions is different from lengths, widths or heights of the other extending portions.

3. The heat pipe structure of claim 1, wherein thicknesses or sizes of the first and second plates are different.

4. The heat pipe structure of claim 1, wherein the first and second plates are connected by a heating welding or fit bonding process at a point close to a side wall of the chamber to form a sealing portion.

5. The heat pipe structure of claim 4, wherein the heating welding process comprises a laser welding, a diffusion welding, a supersonic welding or any of their combinations.

6. The heat pipe structure of claim 4, wherein the frit bonding process comprises a hard welding, a glue bonding or any of their combinations.

7. The heat pipe structure of claim 4, wherein the heating welding or frit bonding process is a lateral connecting type.

8. The heat pipe structure of claim 1, wherein the first plate or the second plate is directly contacted with an external heat source.

9. The heat pipe structure of claim 1, further comprising:
   at least a water injecting channel communicating with the chamber.

* * * * *